United States Patent
Kossel et al.

(10) Patent No.: US 10,541,691 B1
(45) Date of Patent: Jan. 21, 2020

(54) BANG-BANG PHASE DETECTORS

(71) Applicant: International Business Machines Corporation, Armonk, NY (US)

(72) Inventors: Marcel A. Kossel, Reichenburg (CH); Pier Andrea Francese, Adliswil (CH); Thomas H. Toifl, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/283,991

(22) Filed: Feb. 25, 2019

(51) Int. Cl.
  *H03L 7/06* (2006.01)
  *H03L 7/081* (2006.01)
  *H03L 7/085* (2006.01)
  *H03K 19/20* (2006.01)

(52) U.S. Cl.
  CPC ............ *H03L 7/0812* (2013.01); *H03L 7/085* (2013.01); *H03K 19/20* (2013.01)

(58) Field of Classification Search
  USPC .................................. 327/147–149, 156–158
  See application file for complete search history.

(56) References Cited

U.S. PATENT DOCUMENTS

| | | | | |
|---|---|---|---|---|
| 5,691,656 A * | 11/1997 | Sandusky | ............... | G01R 25/00 327/12 |
| 9,191,185 B2 | 11/2015 | Chen | | |
| 2001/0007436 A1 * | 7/2001 | Dosho | ................... | H03D 13/004 331/11 |
| 2007/0147570 A1 * | 6/2007 | Lin | ...................... | H03D 13/003 375/375 |
| 2008/0238489 A1 * | 10/2008 | Sanduleanu | ............ | H03L 7/087 327/42 |
| 2011/0063003 A1 * | 3/2011 | Friedman | ................ | H03L 7/089 327/157 |
| 2011/0187413 A1 * | 8/2011 | Suzuki | ................... | H03D 13/00 327/12 |

(Continued)

FOREIGN PATENT DOCUMENTS

JP 2017509217 A 3/2017

OTHER PUBLICATIONS

Mark G. Johnson and Edwin L. Hudson "A Variable Delay Line PLL for CPU-Coprocessor Synchronization" IEEE Journal of Solid-State Circuits, vol. 23, No. 5, Oct. 1988.

*Primary Examiner* — Adam D Houston
(74) *Attorney, Agent, or Firm* — Harrington & Smith

(57) ABSTRACT

A bang-bang phase detector includes set-reset latch, pulse generator, flip-flop, and pulse-width extension circuits. The set-reset latch circuit has set and reset inputs receiving input signals, and a latch output providing a latch output signal whose state varies in dependence on phases of the input signals. The pulse generator circuit generates sampling pulses at timings dependent on phase of an input signal. The flip-flop circuit has a data input, a clock input connected to the pulse generator circuit receiving the sampling pulses, and an output providing a detector output signal whose state distinguishes positive and negative phase differences between input signals. The pulse-width extension circuit connects between the latch output and data input of the flip-flop circuit, and extends width of pulses of a polarity in the latch output signal to extend range of input signal phase differences over which the detector output signal distinguishes positive and negative phase differences.

20 Claims, 4 Drawing Sheets

(56) References Cited

U.S. PATENT DOCUMENTS

| | | | |
|---|---|---|---|
| 2013/0113536 A1* | 5/2013 | Sfikas | H03L 7/091 |
| | | | 327/158 |
| 2014/0070856 A1* | 3/2014 | Ainspan | H03L 7/087 |
| | | | 327/145 |
| 2015/0008961 A1* | 1/2015 | Kim | H03L 7/085 |
| | | | 327/12 |
| 2015/0215110 A1* | 7/2015 | Chen | H03K 3/037 |
| | | | 375/362 |
| 2016/0065195 A1 | 3/2016 | Farazian et al. | |
| 2016/0126961 A1* | 5/2016 | Chen | H03L 7/089 |
| | | | 327/156 |
| 2018/0083809 A1* | 3/2018 | Tajalli | H03L 7/087 |
| 2018/0115410 A1 | 4/2018 | Tajalli et al. | |
| 2018/0287774 A1* | 10/2018 | Wei | H04L 7/0331 |

* cited by examiner

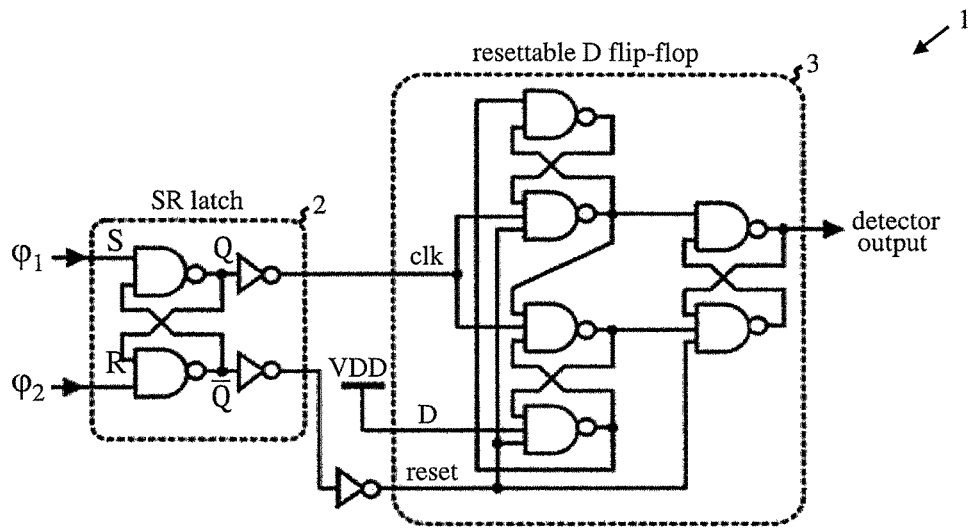
Figure 1
|  | | S | R | lead Q $\overline{Q}$ | lag Q $\overline{Q}$ |
|---|---|---|---|---|---|
| set | I | 1 | 0 | 0  1 | 0  1 |
| hold | II | 1 | 1 | 0  1 | 1  1 |
| reset | III | 0 | 1 | 1  0 | 1  0 |
|  | IV | 0 | 0 | 1  1 | 1  1 |
Figure 2
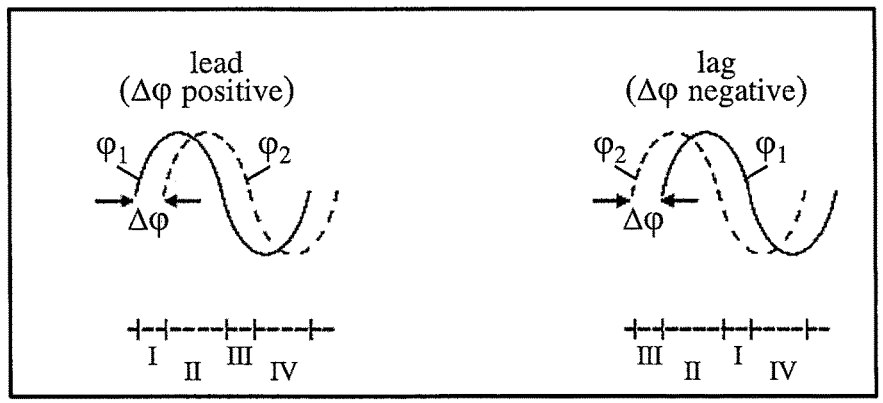
Figure 3

BANG-BANG PHASE DETECTORS

BACKGROUND

The present invention relates generally to bang-bang phase detectors. Bang-bang phase detectors are provided, together with multiphase generator apparatus incorporating such detectors.

A bang-bang phase detector compares the phase of two input signals and provides an output which distinguishes positive and negative phase differences between the input signals. In particular, the state (e.g. logic 0 or logic 1) of the detector output indicates whether the phase of one of the input signals leads, or lags behind, phase of the other. A transition in the detector output state thus indicates phase coincidence, or "phase lock". Bang-bang phase detectors can be used, for example, in communication circuits such as I/O (Input/Output) link transceiver circuits of data processors and communications systems to set the phase of a reference clock signal used for data transmission/recovery.

A bang-bang phase detector typically comprises a set-reset (SR) latch followed by a data flip-flop (D flip-flop). The input signals to be phase-compared are supplied to the set and reset inputs of the SR latch. The latch detects the input phase relationship, providing a latch output signal whose state varies in dependence on the input signal phases. The latch output signal is supplied to the D flip-flop which latches a value indicative of the phase relationship at timings dependent on pulses at a clock input of the D flip-flop. The moment of D flip-flop output toggling indicates phase lock. The range of input signal phase differences over which the detector correctly indicates phase lock is limited by timing factors relating to the D flip-flop input signals. The D flip-flop output will correctly distinguish positive and negative phase differences for a range of phase differences around the phase locking point. With increasing phase difference, however, false phase locks can occur due to erroneous transitions in the D flip-flop output which are unrelated to phase coincidence of the input signals.

The above problem restricts the operative phase range of a bang-bang phase detector to the range over which false phase locking does not occur. The phase range over which such detectors operate reliably can also vary with frequency of the input signals. This causes particular difficulty in applications which demand operation over a wide range of input phase differences and/or frequencies. An example of such an application is the calibration of delay-line based multiphase generators in which a plurality of different signal phases are generated from a reference clock for signal sampling in high-speed receivers.

SUMMARY

According to an aspect there is provided a bang-bang phase detector. The detector comprises a set-reset latch circuit, a pulse generator circuit, a data flip-flop circuit and a pulse-width extension circuit. The set-reset latch circuit has set and reset inputs for receiving respective input signals, and a latch output for providing a latch output signal whose state varies in dependence on phases of the input signals. The pulse generator circuit is configured to generate sampling pulses at timings dependent on phase of one of the input signals. The data flip-flop circuit has a data input, a clock input connected to the pulse generator circuit for receiving the sampling pulses, and an output for providing a detector output signal whose state distinguishes positive and negative phase differences between the input signals. The pulse-width extension circuit is connected between the latch output and the data input of the data flip-flop circuit. The pulse-width extension circuit is configured to extend the width of pulses of a predetermined polarity in the latch output signal to extend the range of input signal phase differences over which the detector output signal correctly distinguishes said positive and negative phase differences.

In detectors embodying examples, the D flip-flop (DFF) produces the detector output signal by sampling the signal at its data input at timings determined by the sampling pulses at its clock input. The pulse-width extension circuit supplies the signal at the data input of the DFF. This signal is produced extending the width of pulses of a predetermined polarity in the latch output signal. As explained in detail below, this pulse-width extension allows the sampling pulses clocking the DFF to produce the correct detector output signal over a wider range of input signal phase differences than would be possible without the pulse-width extension. Embodiments thus provide reliable bang-bang phase detectors in which false locks are avoided over an extended operational range.

In example embodiments, the latch circuit comprises a symmetrical set-reset latch circuit in which each of the set and reset inputs is connected to opposite inputs of a respective pair of two-input logic gates which have a common output. Such a symmetrical SR latch with twisted inputs increases the phase matching accuracy of the detector. Examples of embodiments below employ an SR NAND latch in which the logic gates are NAND gates.

The polarity (i.e. up or down, corresponding to logic 1 or logic 0 respectively) of the pulses whose width is extended will depend on the particular circuit implementation. In examples of embodiments below, the pulse-width extension circuit is configured to extend the width of down pulses in the latch output signal. This can be achieved with a simple circuit implementation in the pulse-width extension circuit.

The pulse generator circuit can be conveniently configured to generate the sampling pulses from differently-delayed edges of one of the input signals such that one sampling pulse is generated in each cycle of that input signal. Latency in a signal path through the pulse generator circuit to the DFF clock input can be matched to latency in a signal path from the latch output to the DFF data input to provide a fixed timing relationship between the signals at the DFF clock and data inputs.

In particular examples of embodiments, the latch circuit has Q and $\overline{Q}$ outputs corresponding respectively to the set and reset inputs, and the pulse generator circuit is connected to one of the set and reset inputs for receiving the input signal at that input. The aforementioned latch output is the $\overline{Q}$ output if the pulse generator is connected to the set input, and the Q output if the pulse generator is connected to the reset input. The sampling pulses are thus derived from a "reference" input signal at one latch input, and the latch output signal is obtained from the output corresponding to the other latch input. This provides additional latency for generation of the sampling pulses as discussed further below.

A further aspect provides multiphase generator apparatus for generating a plurality of clock signal phases from a reference clock signal. The apparatus includes a delay line for receiving the reference clock signal, the delay line comprising a series of tunable delay stages for producing respective clock signal phases. The apparatus further comprises a bang-bang phase detector as described above for receiving two of the clock signal phases as respective detector input signals, and control logic for receiving the detector output signal. The control logic is configured to generate a control code for tuning the delay stages of the delay line in dependence on the detector output signal. Use of the bang-bang phase detector allows multiphase generators to operate over a broad range of clock signal frequencies and phase differences.

Embodiments will be described in more detail below, by way of illustrative and non-limiting example, with reference to the accompanying drawings.

BRIEF DESCRIPTION OF THE SEVERAL VIEWS OF THE DRAWINGS

FIG. 1 shows an implementation of a conventional bang-bang phase detector;

FIG. 2 shows a truth-table for an SR latch in the FIG. 1 detector;

FIG. 3 indicates successive states of the SR latch for positive and negative phase differences between the SR latch input signals;

DETAILED DESCRIPTION

The problem of false phase locking will be explained briefly for a conventional bang-bang phase detector (BBPD), illustrated in FIG. 1, of a general type described in U.S. Pat. No. 9,191,185 B2. The BBPD 1 comprises a SR NAND latch circuit 2 connected to a resettable DFF 3. The SR latch has set (S) and reset (R) inputs which receive input clock signals, $\varphi_1$ and $\varphi_2$ respectively, whose phase relationship is to be detected. The Q and $\overline{Q}$ outputs of the latch are connected, here via inverters (NOT gates) as shown, to the clock (clk) and reset inputs of the DFF 3. The clock input receives the signal NOT Q and the reset input receives the signal $\overline{Q}$. The data (D) input of DFF 3 is tied to VDD and is thus held high, i.e. at logic 1. Hence, the DFF samples logic 1 at its D input when NOT Q goes high at its clock input. Logic 1 then appears at the output of the DFF which provides the detector output as indicated in the figure. The detector output is reset to logic 0 when $\overline{Q}$ goes low at the reset input of the DFF.

FIG. 2 shows the truth-table for SR latch 2. As indicated by the arrows in the table, the latch cycles through output states I (set), II (hold), III (reset) and IV in a different order for positive and negative phase differences between the input signals $\varphi_1$ and $\varphi_2$. This is illustrated in FIG. 3 which shows the order of output states for phase lead ($\varphi_1$ leads $\varphi_2$) and phase lag ($\varphi_1$ lags $\varphi_2$). This difference between the SR latch outputs in phase lead and phase lag allows the BBPD 1 to distinguish the two phase relationships, whereby toggling of the DFF output indicates phase lock.

Figure 4:
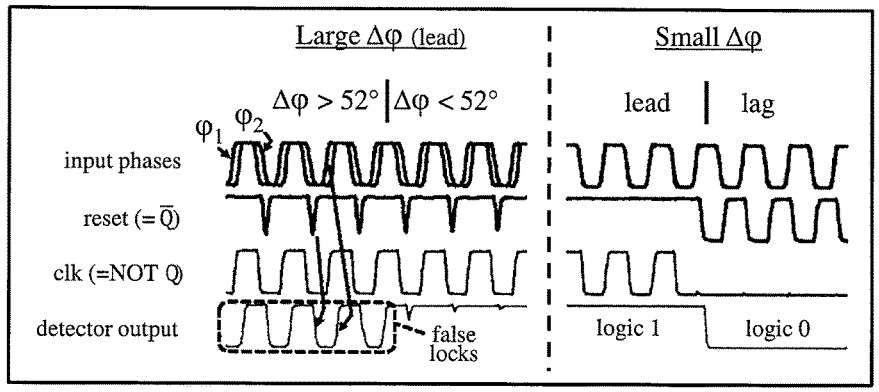
FIG. 4 illustrates signals in the FIG. 1 detector for different input signal phase relationships.

The signal diagram of FIG. 4 shows that this operating principle works well near the phase locking point, i.e. for small values of $\Delta\varphi=(\varphi_1-\varphi_2)$ as shown on the right of the figure. (The two input phases are seen as virtually coincident here because of the small input phase difference $\Delta\varphi$). For phase leading here, the clock input of DFF 3 receives the toggling NOT Q signal. The DFF thus reads the constant D-input so that its output becomes logical 1. For phase lagging, the clock is gated and the toggling $\overline{Q}$ signal resets the DFF. According to the truth table of FIG. 2, this behavior around the phase lock point occurs because the reset pulse ($\overline{Q}$=0 in column 'lead') and the set pulse (NOT Q=1, Q=0 in column 'lag') can no longer reach their logical levels for small input phase differences. Hence, when changing between phase lead and phase lag, the toggling of the SR-latch output switches between Q and $\overline{Q}$ while the other output remains constant. However, the missing pulses start to reappear with increasing phase difference $\Delta\varphi$. Simulations in 7 nm (seven nanometer) technology have shown that for $\Delta\varphi$ greater than 9 ps (about 52° at input signal frequency f=16 GHz, and about 13° (thirteen degrees, where "°" means degrees) at f=4 GHz) the previously missing pulses reappear and the BBPD fails to operate correctly. This is illustrated on the left of FIG. 4 where, at f=16 GHz, for $\Delta\varphi$>52° the reset pulses at the $\overline{Q}$ output of the SR-latch build up sufficiently that the DFF is periodically reset and false locking occurs. Such malfunctioning cannot be accepted, and is especially problematical when operation is required over a wide clock frequency range.

Figure 5:
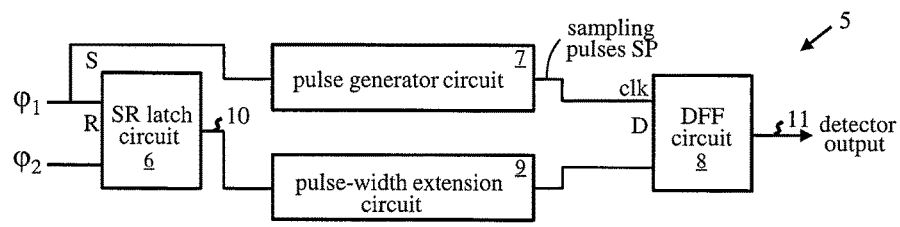
FIG. 5 is a schematic representation of a bang-bang phase detector in accordance with an example of an embodiment.

FIG. 5 is a block diagram of components of a BBPD embodying an example embodiment. The BBPD 5 comprises a SR latch circuit 6, a pulse generator circuit 7, a DFF circuit 8 and a pulse-width extension circuit 9. The SR latch circuit 6 has set and reset inputs for receiving the input signals $\varphi_1$ and $\varphi_2$, and a latch output 10 providing the latch output signal whose state (logic 0 or 1) varies in dependence on phases of the input signals. Pulse generator circuit 7 is configured to generate sampling pulses SP at timings dependent on phase of one of the input signals. In this example, the pulse generator is connected to the S input of SR latch 6 whereby $\varphi_1$ provides the reference phase for the sampling pulse generation. The clock input clk of DFF 8 is connected to the output of pulse generator 7 for receiving the sampling pulses SP. The pulse-width extension circuit 9 is connected between the SR latch output 10 and the data input D of DFF 8. The DFF thus samples the signal at its D-input at timings corresponding to the sampling pulses at its clock input. An output 11 of DFF 8 provides the detector output signal whose state distinguishes positive and negative phase differences between the input signals $\varphi_1$ and $\varphi_2$. The detector output state thus depends on the state of the D-input at the sampling pulse timings. The D-input signal is produced by pulse-width extension circuit 9 from the SR latch output signal. The pulse-width extension circuit 9 is configured to extend the width of pulses of a predetermined polarity in the latch output signal to extend the range of input signal phase differences over which the detector output signal correctly distinguishes positive and negative phase differences between $\varphi_1$ and $\varphi_2$. In particular, by extending the width of pulses of a particular polarity (which depends on circuit implementation), the time window for correct sampling of these pulses by DFF 8 in response to the sampling pulses SP is extended. This provides correct detector operation, in which false locking is avoided, over a wider range of input signal phase differences $\Delta\varphi$.

Figure 6:
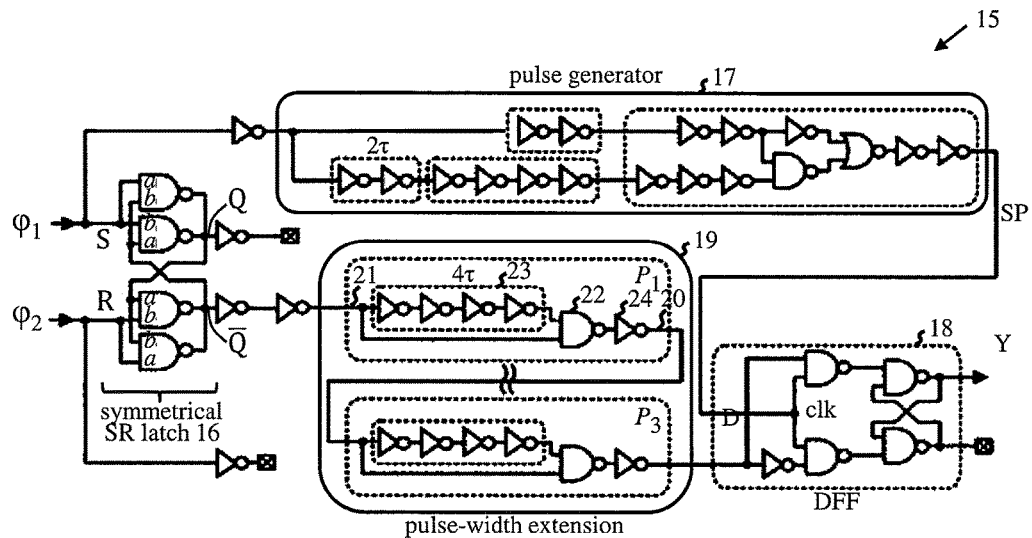
FIG. 6 shows a detailed implementation of an example of an embodiment of the detector.

Detector operation is explained in more detail below for the exemplary circuit implementation shown in FIG. 6. This BBPD 15 comprises an SR latch circuit 16, a pulse generator 17, a non-resettable DFF 18, and a pulse-width extension circuit 19. The output Y of DFF 18 provides the detector output signal. All components 16 through 19 are implemented by CMOS (complementary metal-oxide-semiconductor) logic gates connected as shown in the figure. In this example of an embodiment, SR latch 16 comprises a symmetrical SR NAND latch circuit in which each of the set and reset inputs is connected to opposite inputs of a respective pair of two-input NAND gates which have a common output. In particular, the set input is connected to opposite inputs a and b of a first pair of NAND gates whose common output provides the Q output of the latch. Similarly, the reset input is connected to opposite inputs a and b of a second pair of NAND gates whose common output provides the $\overline{Q}$ output of the latch. The outputs Q and $\overline{Q}$ of each pair are fed back to the remaining NAND gate inputs of the other pair as shown. This provides a symmetrical SR latch with twisted inputs, and ensures that each input phase $\varphi_1$, $\varphi_2$ is treated exactly the same with respect to the loading and overdrive of the NAND gates. Without this symmetry, the input phases are not treated equally because of the stacking of FET (field-effect transistor) switches in the CMOS NAND gates, and this then compromises phase detection accuracy.

The pulse generator 17 is connected to the S input of the SR latch 16, whereby input $\varphi_1$ provides the reference phase for sampling pulse generation. An inverter provided between the S input and the pulse generator inhibits signal kick-backs from the subsequent circuitry at the S input. Since the pulse generator is connected to latch input S, the latch output $\overline{Q}$, corresponding to the other latch input R, provides the latch output signal which is supplied to the pulse-width extension circuit 19 in this embodiment. As explained further below, this arrangement gives more latency for sampling pulse generation. The latch output $\overline{Q}$ is connected to pulse-width extension circuit 19 via two inverters (for kick-back avoidance and also latency-matching to the sampling pulse path as discussed below). Latch output Q drives into an open circuit via a load-matching inverter.

Figure 7:
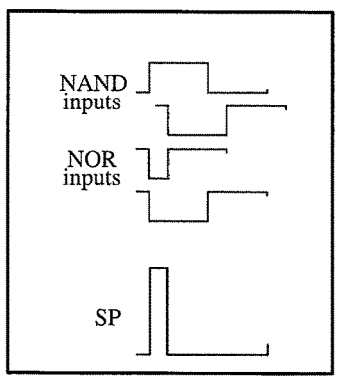
FIG. 7 illustrates generation of sampling pulses in a pulse generator of the FIG. 6 detector.

The pulse generator 17 is configured to generate the sampling pulses SP from differently-delayed edges of $\varphi_1$ such that one sampling pulse is generated in each cycle of $\varphi_1$. In particular, parallel signal paths in the pulse generator feed differently-delayed edges of $\varphi_1$ to a NAND gate. The different delays are introduced by the different numbers of inverters (each providing a delay $\tau$) in the parallel paths. The difference in the parallel path delays, here $4\tau$, determines the sampling pulse width. The NOR gate after the NAND gate in pulse generator 17 ensures that a sampling pulse SP is only generated from the first half-cycle of $\varphi_1$. This is illustrated in the signal diagram of FIG. 7 which shows the input signals to the NAND gate and the subsequent NOR gate, along with the resulting sampling pulse SP.

The pulse width-extension circuit 19 of this embodiment is configured to extend the width of down pulses in the latch output signal $\overline{Q}$. This circuit 19 comprises a set of n like circuit modules $P_1$ to $P_n$ which are connected in series between the SR latch output and the D-input of DFF 18. In this embodiment, n=3 and only the first and last modules $P_1$ and $P_3$ are shown in the figure. As indicated in relation to $P_1$ in the figure, each module has a module output 20, a module input 21 which is connected to one input of a two-input NAND gate 22, a delay circuit 23 connected between the other input of the NAND gate and the module input 21, and an inverter 24 which is connected between the NAND gate 22 and the module output 20. The modules $P_1$ to $P_3$ provide successive stages of pulse-width extension for down pulses in the latch output signal $\overline{Q}$. In each module, a logical 0 at input 21 produces logic 1 at the output of NAND gate 22 and hence logic 0 appears at module output 20. However, a logical 1 at input 21 is delayed by delay stage 23 before producing logic 0 at the output of NAND gate 23 and hence logic 1 at module output 20. In effect, therefore, $\overline{Q}$=0 appears immediately at the module output 20 whereas the rising edge on switching to $\overline{Q}$=1 is delayed in one of the NAND input paths, thus extending the down pulse width. The delay ($4\tau$) introduced by delay stage 23 is matched to the difference in the parallel signal path delays in pulse generator 17. Overall latency in the signal path through pulse generator 17 from the S input of latch 16 to the DFF clock input is matched to latency in the signal path from the latch output $\overline{Q}$ to the D input of the DFF. This ensures that the sampling pulses SP at the clock input have a fixed timing relationship to the pulse-extended latch output signal supplied to the D input.

Figure 8:
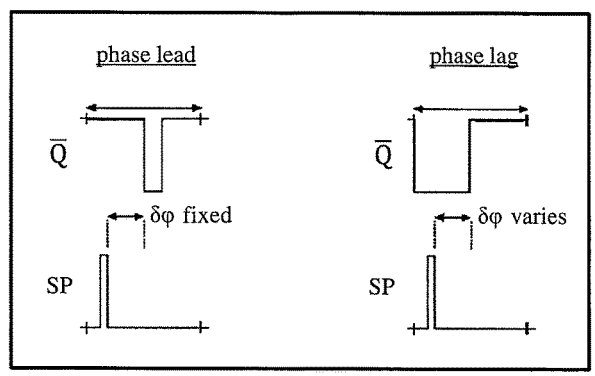
FIG. 8 illustrates the timing relationship between sampling pulses and a latch output signal in the FIG. 6 detector.

In BBPD 15, the latch output signal $\overline{Q}$ varies with the input signal phases as indicated in FIGS. 2 and 3. Hence, for phase lead (positive $\Delta_T$), $\overline{Q}$ cycles through states 1101. For phase lag (negative $\Delta\varphi$), $\overline{Q}$ cycles through states 0011. Detector 15 distinguishes the two phase relationships by sampling the first two bits of these patterns at the D input of DFF 18 in response to the sampling pulses at the clock input. FIG. 8 indicates timing of the sampling pulses SP in relation to the $\overline{Q}$ bit-patterns for phase lead and phase lag. As illustrated here, the sampling pulses occur with a fixed phase relationship $\delta\varphi$ to the first two bits of $\overline{Q}$ during phase lead, but with a variable phase relationship $\delta\varphi$ to the first two bits of $\overline{Q}$ during phase lag. For phase lead, this occurs because the pulses SP are generated from $\varphi_1$ and the down pulse in $\overline{Q}$ is triggered by the falling edge of $\varphi_1$ (see FIG. 3). For phase lag, however, the rising edge of the down-pulse in $\overline{Q}$ is triggered by the falling edge of $\varphi_2$, and the timing of this edge varies with the phase of $\varphi_2$. As the phase lag increases, the sampling pulse timing moves towards the rising edge of the down pulse in $\overline{Q}$. This edge defines the end of the timing window for correct sampling at DFF 18. If the sampling pulse moves into the rising edge of the down pulse in $\overline{Q}$ during phase lag, false locking can occur. By extending the down pulse-width, the pulse-width extension circuit 19 extends the timing window for correct sampling at DFF 18. In particular, the pulse-width extension ensures that, during phase lag, the sampling pulses at the DFF clock input occur during the extended down pulses in the latch output signal $\overline{Q}$ at the D input of the DFF.

The functionality described above allows BBPD 15 to operate correctly over an extended range of input signal phase differences $\Delta\varphi$. The BBPD thus offers reliable operation over a wider range of input frequencies f, and accommodates a greater range of PVT (process voltage temperature) variations in circuit implementations. Use of the symmetrical SR latch 16 for mismatch mitigation and equal input overdrive further increases phase matching accuracy. The down-pulse extension is effected via simple, replicated circuit modules, and a simple, non-resettable DFF 18 is used to produce the detector output. Since the sampling pulses are derived from $\varphi_1$ at the S input of latch 16 in this embodiment, the $\overline{Q}$ output of the latch is selected for capture by DFF 18. The reason is that the distance from the rising edge of the S input to the nearest up-going pulse at Q or $\overline{Q}$, for phase lead is then maximized. This gives a gain in latency for generation of the sampling pulse as $\overline{Q}$ must be sampled prior to the falling edge at S during phase lead.

Figure 9:
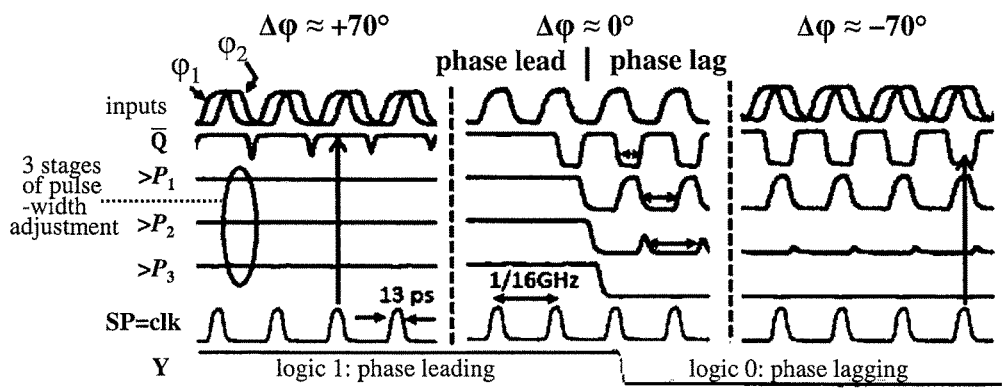
FIG. 9 illustrates signals in the FIG. 6 detector for different input signal phase relationships at an input signal frequency of 16 GHz.
Figure 10:
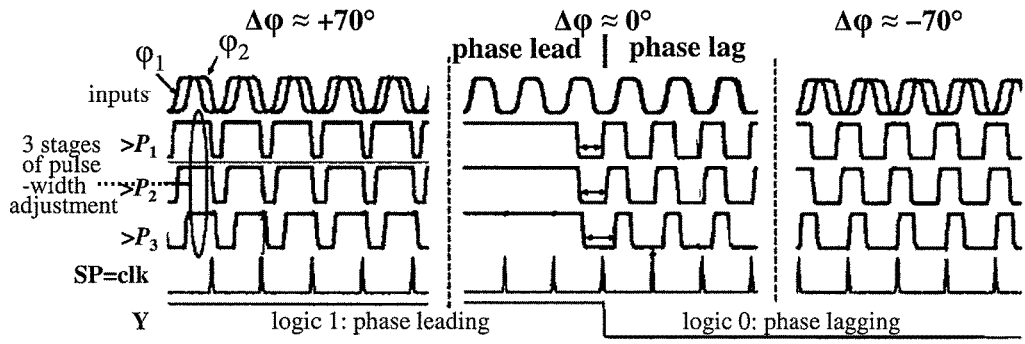
FIG. 10 illustrates corresponding signals at an input signal frequency of 4 GHz.

The signal diagram of FIG. 9 illustrates operation of BBPD 15 at f=16 GHz. For phase lead at Δφ=+70°, the down pulse in $\overline{Q}$ is too short to pass through NAND gate 22 in modules $P_1$ to $P_3$. The pulse-width adjustment stages thus eliminate the down pulse entirely, and the sampling pulses always sample $\overline{Q}$=1 as required (see vertical arrow indicating sample timing). For phase lead at small Δφ, the down pulses are eliminated in $\overline{Q}$. For phase lag, the down pulses appear in $\overline{Q}$ and the three stages of pulse-width adjustment gradually extend the down pulse width. At this operating frequency, the three concatenated pulse-width extension stages can even eliminate the up-going portion of the $\overline{Q}$ pulses completely, so that correct sampling of $\overline{Q}$=0 becomes very easy. FIG. 10 illustrates corresponding signals ($\overline{Q}$ omitted) at f=4 GHz. Due to the lower speed, the down-going reset pulses at $\overline{Q}$ during phase lead can build up completely, and the down pulse extension extends these pulses too. However, both the sampling pulses and the falling edge of these down pulses are derived from $\varphi_1$, so $\overline{Q}$=1 is still sampled correctly and the pulse-width extension is not harmful for phase lead. The signals for phase lag illustrate how the three stages of pulse-width extension gradually extend the down pulses in $\overline{Q}$ to ensure correct sampling of $\overline{Q}$=0. At Δφ=−70°, sampling occurs towards the end of the extended down pulses. Correct sampling of $\overline{Q}$=0 becomes marginal just after this point. However, the timing window could be further extended by an additional pulse-width extension module $P_4$.

Figure 11:
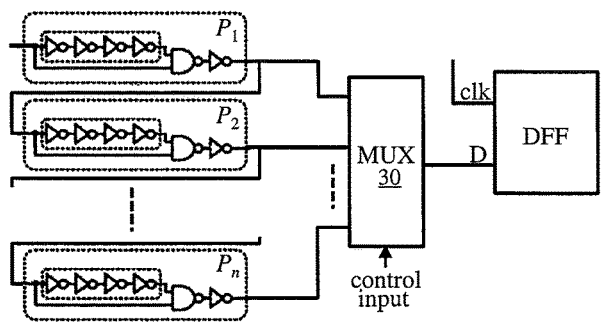
FIG. 11 is a schematic representation of a modified pulse-width extension circuit for the FIG. 6 detector.

The pulse-width extension circuit may in general comprise one or more extension stages, e.g. modules P, to provide sufficient pulse-width extension for the required phase sweep and frequency range of the detector. In some embodiments, the number of extension stages may be selectable to accommodate different operating conditions. An exemplary implementation here is illustrated in FIG. 11. In this embodiment, the outputs of a number of pulse-width extension stages $P_1$ to $P_n$ are connected to a multiplexer (MUX) 30. The MUX 30 selectively connects the output of one stage to the D input of the DFF in response to a control input. In this arrangement, a desired number of extension modules can be selectively connected in series between the latch output and the D input of the DFF, allowing selective adjustment of the amount of pulse-width extension. The pulse-width extension can thus be readily configured to the desired detector operating range. Too much pulse-width extension may ultimately interfere with the correct sampling during phase lead and requires pertinent latency matching in the pulse generation path, which might become costly from an area and power consumption viewpoint. Consequently, it is desirable to introduce no more than the minimum amount of pulse-width extension required for a given operating scenario.

Figure 12:
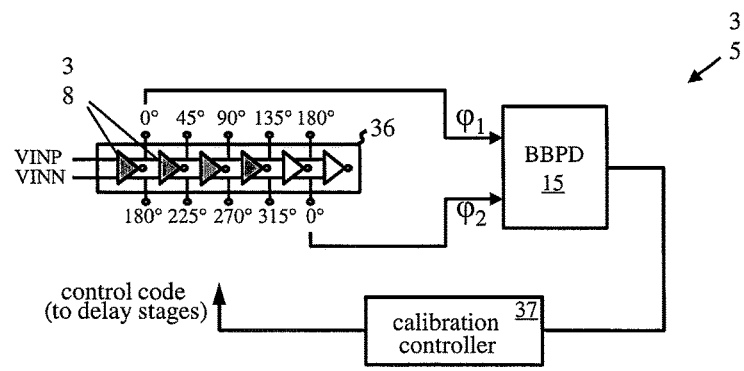
FIG. 12 is a schematic representation of a multiphase generator apparatus embodying an example.

Due to their increased phase and frequency range, BBPDs having example embodiments herein can be employed to advantage in multiphase generator apparatus such as IQ4 (In-phase/Quadrature) generators. Such multiphase generators serve to generate a plurality of clock signal phases from a reference clock signal, and can be used for sampling phase generation in receivers for high-speed communication links. FIG. 12 shows a multiphase generator 35 employing the BBPD 15 of FIG. 6 for operation over a 4 to 16 GHz frequency range. The apparatus 35 receives a reference clock signal, here a differential clock signal VINP/VINN, and generates four pairs of equally-spaced sampling phases (0°/180°, 45°/225°, 90°/270° and 135°/315°). The BBPD is used to calibrate a CMOS delay line that generates these phases. In particular, the apparatus 35 comprises a delay line 36 which receives the reference clock VINP/VINN, the BBPD 15, and a calibration controller 37. The delay line 36 comprises a series of digitally tuneable delay stages 38 for producing respective sampling phases as illustrated. During calibration, all six delay stages 38 are enabled (the last stage being used for load balancing only). BBPD 15 receives two of the sampling phases, here the 0° output phases of the first and fifth delay stages, as the detector input signals $\varphi_1$ and $\varphi_2$. The BBPD output signal is supplied to calibration controller 37. The calibration controller comprises control logic which generates a control code for tuning the delay stages 38, in dependence on the BBPD output signal, to bring the sampling phases $\varphi_1$ and $\varphi_2$ into phase alignment. Calibration controller 37 and delay stages 38 can be implemented in well-known manner. After calibration, the BBDP and the last two stages of the delay line 36 are powered-down, and only the first four delay stages, shown shaded in the figure, generate the four differential clock phases, separated by 45°, for the sampling operation.

Numerous changes and modifications can of course be made to the exemplary embodiments described above. For example, the sampling pulses could be derived from the input signal at the reset input of the SR latch. The latch output signal supplied to the pulse-width extension circuit could then be taken from the Q output of the SR latch in the FIG. 6 embodiment. The pulse generator circuit and pulse-width extension circuit may be implemented in various other ways as will be apparent to those skilled in the art. The SR latch might be implemented with logic gates other then NAND gates, e.g. NOR gates, in some embodiments. In general, the particular polarity of the pulses to be extended for increased detector phase range depends on implementation details of the detector circuitry. Embodiments can therefore be envisaged in which the pulse-width extension circuit extends up pulses in a latch output signal.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A bang-bang phase detector comprising:
  a set-reset latch circuit having set and reset inputs for receiving respective input signals and a latch output for providing a latch output signal whose state varies in dependence on phases of the input signals;
  a pulse generator circuit configured to generate sampling pulses at timings dependent on phase of one of the input signals;
  a data flip-flop circuit having a data input, a clock input connected to the pulse generator circuit for receiving said sampling pulses, and an output for providing a detector output signal whose state distinguishes positive and negative phase differences between the input signals; and
  a pulse-width extension circuit, connected between said latch output and said data input, configured to extend the width of pulses of a predetermined polarity in the latch output signal to extend the range of input signal phase differences over which the detector output signal correctly distinguishes said positive and negative phase differences.

2. A detector as claimed in claim 1, wherein said latch circuit comprises a symmetrical set-reset latch circuit in which each of said set and reset inputs is connected to opposite inputs of a respective pair of two-input logic gates which have a common output.

3. A detector as claimed in claim 2, wherein said logic gates are NAND gates.

4. A detector as claimed in claim 1, wherein the pulse-width extension circuit is configured to extend the width of down pulses in the latch output signal.

5. A detector as claimed in claim 1, wherein the pulse generator circuit is configured to generate the sampling pulses from differently-delayed edges of said one of the input signals such that one sampling pulse is generated in each cycle of that input signal.

6. A detector as claimed in claim 1, wherein the pulse generator circuit and the pulse-width extension circuit are adapted such that latency in a signal path through the pulse generator circuit to said clock input is matched to latency in a signal path from said latch output to said data input.

7. A detector as claimed in claim 1, wherein:
said latch circuit has Q and $\overline{Q}$ outputs corresponding respectively to the set and reset inputs;
the pulse generator circuit is connected to one of the set and reset inputs for receiving the input signal at that input; and
said latch output is the $\overline{Q}$ output if the pulse generator is connected to the set input and the Q output if the pulse generator is connected to the reset input.

8. A detector as claimed in claim 7, wherein the latch circuit comprises a set-reset NAND latch circuit, and wherein the pulse generator circuit is configured to generate the sampling pulses such that one sampling pulse is generated for each first half-cycle of the input signal at said one of the set and reset inputs.

9. A detector as claimed in claim 8, wherein the pulse-width extension circuit is configured to extend the width of down pulses in the latch output signal such that, when phase of the input signal at said one of the set and reset inputs lags behind phase of the other input signal, the sampling pulses at said clock input occur during the extended down pulses at said data input.

10. A detector as claimed in claim 7, wherein:
the pulse generator circuit is configured to generate the sampling pulses from differently-delayed edges of the input signal at said one of the set and reset inputs; and
the pulse generator circuit and the pulse-width extension circuit are adapted such that latency in a signal path through the pulse generator circuit to said clock input is matched to latency in a signal path from said latch output to said data input.

11. A detector as claimed in claim 7, wherein said latch circuit comprises a symmetrical set-reset latch circuit in which each of said set and reset inputs is connected to opposite inputs of a respective pair of two-input logic gates which have a common output.

12. A detector as claimed in claim 11, wherein said logic gates are NAND gates.

13. A detector as claimed in claim 4, wherein the pulse-width extension circuit comprises at least one circuit module having: a module output; a module input connected to one input of a two-input NAND gate, a delay circuit connected between the other input of the NAND gate and the module input, and an inverter connected between the NAND gate and the module output.

14. A detector as claimed in claim 13, wherein the pulse-width extension circuit comprises a plurality of said circuit modules which are selectively connectable in series between said latch output and said data input for selective adjustment of the amount of pulse-width extension effected by the pulse-width extension circuit.

15. A detector as claimed in claim 1, wherein the data flip-flop circuit comprises a non-resettable data flip-flop.

16. Multiphase generator apparatus for generating a plurality of clock signal phases from a reference clock signal, the apparatus comprising
a delay line for receiving said reference clock signal, the delay line comprising a series of tunable delay stages for producing respective said clock signal phases,
a bang-bang phase detector for receiving two of said clock signal phases as respective detector input signals, the detector being configured to produce a detector output signal whose state distinguishes positive and negative phase differences between said input signals, and
control logic for receiving said detector output signal and generating a control code for tuning said delay stages in dependence on the detector output signal,
wherein the bang-bang phase detector comprises:
a set-reset latch circuit having set and reset inputs for receiving respective said input signals and a latch output for providing a latch output signal whose state varies in dependence on phases of the input signals;
a pulse generator circuit configured to generate sampling pulses at timings dependent on phase of one of the input signals;
a data flip-flop circuit having a data input, a clock input connected to the pulse generator circuit for receiving said sampling pulses, and an output for providing said detector output signal; and
a pulse-width extension circuit, connected between said latch output and said data input, configured to extend the width of pulses of a predetermined polarity in the latch output signal to extend the range of input signal phase differences over which the detector output signal correctly distinguishes said positive and negative phase differences.

17. Apparatus as claimed in claim 16, wherein said latch circuit comprises a symmetrical set-reset latch circuit in which each of said set and reset inputs is connected to opposite inputs of a respective pair of two-input logic gates which have a common output.

18. Apparatus as claimed in claim 17, wherein said logic gates are NAND gates.

19. Apparatus as claimed in claim 16, wherein the pulse-width extension circuit is configured to extend the width of down pulses in the latch output signal.

20. Apparatus as claimed in claim 16, wherein:
said latch circuit has Q and $\overline{Q}$ outputs corresponding respectively to the set and reset inputs;
the pulse generator circuit is connected to one of the set and reset inputs for receiving the input signal at that input; and
said latch output is the $\overline{Q}$ output if the pulse generator is connected to the set input and the Q output if the pulse generator is connected to the reset input.

* * * * *